United States Patent
Soini et al.

(10) Patent No.: US 10,653,038 B2
(45) Date of Patent: May 12, 2020

(54) HEAT SPREADER

(71) Applicant: Microsoft Technology Licensing, LLC, Redmond, WA (US)

(72) Inventors: Sakari Soini, Somero (FI); Esa Määttä, Espoo (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/099,562

(22) Filed: Apr. 14, 2016

(65) Prior Publication Data

US 2017/0303435 A1    Oct. 19, 2017

(51) Int. Cl.
*H05K 7/20* (2006.01)
*H01L 23/373* (2006.01)
*H01L 23/367* (2006.01)

(52) U.S. Cl.
CPC ..... *H05K 7/20454* (2013.01); *H01L 23/3672* (2013.01); *H01L 23/373* (2013.01)

(58) Field of Classification Search
CPC .......... H05K 7/20454; H05K 7/20472–20481; H01L 23/3672; H01L 23/373
See application file for complete search history.

(56) References Cited

U.S. PATENT DOCUMENTS

| | | | | |
|---|---|---|---|---|
| 4,849,858 A | * | 7/1989 | Grapes | H05K 1/0203 |
| | | | | 165/185 |
| 4,915,167 A | * | 4/1990 | Altoz | F28F 13/00 |
| | | | | 165/185 |
| 5,150,748 A | * | 9/1992 | Blackmon | B64G 1/226 |
| | | | | 165/181 |

(Continued)

FOREIGN PATENT DOCUMENTS

| | | |
|---|---|---|
| CN | 1679383 A | 10/2005 |
| DE | 112012006614 T5 | 3/2015 |

(Continued)

OTHER PUBLICATIONS

Smalc, et al., "Thermal Performance of Natural Graphite Heat Spreaders", In Proceedings of Pacific Rim Technical Conference and Exhibition on Integration and Packaging of MEMS, NEMS, and Electronic Systems collocated with the ASME, Jul. 17, 2005, pp. 1-11.

(Continued)

*Primary Examiner* — Daniel P Wicklund
*Assistant Examiner* — Christopher L Augustin

(57) ABSTRACT

In an embodiment, a heat spreader is disclosed. In an embodiment, the device comprises an electronic device, comprising: an electronic component as a heat source; and a heat conductive sheet, comprising; a folded section having at least two folds of the sheet establishing at least three superimposed layers of the sheet between the folds, wherein the folded section is configured to conduct heat from the heat source; and a layer of sheet, other than that of the three superimposed layers, wherein the layer of sheet is configured to spread heat across the electronic device, and wherein the layer of sheet receives the heat from the folded section; wherein the superimposed layers are closer to the heat source than the layer of sheet. An embodiment relates to a mobile device and another embodiment to a manufacturing method.

20 Claims, 15 Drawing Sheets

(56) References Cited

U.S. PATENT DOCUMENTS

| | | | | |
|---|---|---|---|---|
| 5,315,480 | A * | 5/1994 | Samarov | H01L 23/367 174/252 |
| 5,896,269 | A * | 4/1999 | Autry | H01L 23/3672 165/185 |
| 5,991,155 | A | 11/1999 | Kobayashi et al. | |
| 6,208,517 | B1 * | 3/2001 | Prince | H01L 23/3672 165/185 |
| 6,224,396 | B1 * | 5/2001 | Chan | H05K 3/325 439/66 |
| 6,269,866 | B1 * | 8/2001 | Yamamoto | F28D 15/0233 165/104.26 |
| 6,315,033 | B1 * | 11/2001 | Li | F28D 15/0233 165/104.33 |
| 6,411,513 | B1 * | 6/2002 | Bedard | H01L 23/3672 165/185 |
| 6,436,506 | B1 * | 8/2002 | Pinter | B32B 7/06 257/E23.105 |
| 6,542,371 | B1 * | 4/2003 | Webb | H01L 23/3733 165/185 |
| 6,617,199 | B2 * | 9/2003 | Smith | H01L 23/3733 257/E23.09 |
| 6,907,917 | B2 | 6/2005 | Chu et al. | |
| 7,079,396 | B2 | 7/2006 | Gates et al. | |
| 7,138,029 | B2 | 11/2006 | Norley et al. | |
| 7,150,914 | B2 | 12/2006 | Clovesko et al. | |
| 7,161,809 | B2 | 1/2007 | Ford et al. | |
| 7,280,359 | B2 | 10/2007 | Fujiwara | |
| 7,365,984 | B2 * | 4/2008 | Jeong | H05K 7/20963 165/185 |
| 7,663,883 | B2 * | 2/2010 | Shirakami | H01L 23/373 165/46 |
| 8,004,846 | B2 * | 8/2011 | Okada | H01L 23/433 165/185 |
| 8,955,580 | B2 | 2/2015 | Chen et al. | |
| 2004/0134646 | A1 | 7/2004 | Chu et al. | |
| 2005/0150649 | A1 * | 7/2005 | Tsukamoto | F28F 3/022 165/185 |
| 2005/0180113 | A1 * | 8/2005 | Shirakami | H01L 23/373 361/704 |
| 2005/0183846 | A1 * | 8/2005 | Mok | F28F 3/02 165/104.33 |
| 2005/0276021 | A1 * | 12/2005 | Gates | H01L 23/3672 361/709 |
| 2007/0053168 | A1 | 3/2007 | Sayir et al. | |
| 2007/0146990 | A1 * | 6/2007 | Hsieh | H01L 23/433 361/690 |
| 2007/0289730 | A1 * | 12/2007 | Wu | H01L 23/3672 165/185 |
| 2008/0090137 | A1 * | 4/2008 | Buck | H01M 2/1077 429/120 |
| 2008/0218974 | A1 * | 9/2008 | Bartley | H01L 25/0657 361/709 |
| 2009/0268408 | A1 * | 10/2009 | Liu | G06F 1/20 361/710 |
| 2010/0149761 | A1 * | 6/2010 | Osborne | H04M 1/0249 361/748 |
| 2010/0157537 | A1 * | 6/2010 | Yu | F28F 3/02 361/704 |
| 2011/0198067 | A1 * | 8/2011 | Hada | H01L 23/373 165/185 |
| 2012/0033384 | A1 | 2/2012 | Pillai | |
| 2012/0325453 | A1 * | 12/2012 | Lin | H01L 23/3672 165/185 |
| 2013/0105132 | A1 * | 5/2013 | Huang | F28D 15/0275 165/185 |
| 2013/0108906 | A1 * | 5/2013 | Bhardwaj | H01M 10/0431 429/94 |
| 2013/0147026 | A1 * | 6/2013 | Topacio | H01L 23/36 257/698 |
| 2013/0199770 | A1 * | 8/2013 | Cherian | F28F 3/00 165/185 |
| 2013/0273349 | A1 | 10/2013 | Choi et al. | |
| 2014/0146479 | A1 * | 5/2014 | Kilroy | H01L 23/367 361/717 |
| 2014/0174706 | A1 * | 6/2014 | Yamada | B23K 35/0233 165/185 |
| 2014/0217575 | A1 * | 8/2014 | Hung | H01L 21/50 257/713 |
| 2014/0332193 | A1 * | 11/2014 | Oh | H05K 7/20454 165/185 |
| 2015/0092351 | A1 * | 4/2015 | Chowdhury | F28F 21/06 361/704 |
| 2015/0216031 | A1 | 7/2015 | Harvilchuck | |
| 2015/0301568 | A1 * | 10/2015 | Hill | H05K 7/20445 361/714 |

FOREIGN PATENT DOCUMENTS

| | | |
|---|---|---|
| DE | 112013007178 T5 | 3/2016 |
| EP | 2697827 A1 | 2/2014 |
| WO | 2007081617 A2 | 7/2007 |
| WO | 2011102572 A1 | 8/2011 |

OTHER PUBLICATIONS

"Office Action Issued in European Patent Application No. 17719119.4", dated Nov. 7, 2019, 4 Pages.

"International Search Report and Written Opinion Issued in PCT Application No. PCT/US2017/026875", dated Jul. 18, 2017, 11 Pages.

* cited by examiner

HEAT SPREADER

BACKGROUND

Different types of electrical devices may have various electrical components. The electrical components may be located inside a housing of the device or sometimes extending exterior to the device, typically on a printed circuit board, PCB, of the device, between the PCB and a cover. Electrical components may generate heat, and temperature may have an effect on an operation of the electrical components and on the device. Due to increased performance of the electrical devices, power dissipation in the devices has steadily increased and affects an overall power and performance of the device.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

In an embodiment, a heat spreader is disclosed. In an embodiment, the device comprises an electronic device, comprising: an electronic component as a heat source; and a heat conductive sheet, comprising; a folded section having at least two folds of the sheet establishing at least three superimposed layers of the sheet between the folds, wherein the folded section is configured to conduct heat from the heat source; and a layer of sheet, other than that of the three superimposed layers, wherein the layer of sheet is configured to spread heat across the electronic device, and wherein the layer of sheet receives the heat from the folded section; wherein the superimposed layers are closer to the heat source than the layer of sheet.

An embodiment relates to a mobile device and another embodiment to a manufacturing method.

Many of the attendant features will be more readily appreciated as they become better understood by reference to the following detailed description considered in connection with the accompanying drawings.

DESCRIPTION OF THE DRAWINGS

The present description will be better understood from the following detailed description read in light of the accompanying drawings, wherein.

Like references are used to designate like parts in the accompanying drawings.

DETAILED DESCRIPTION

Figure 1:
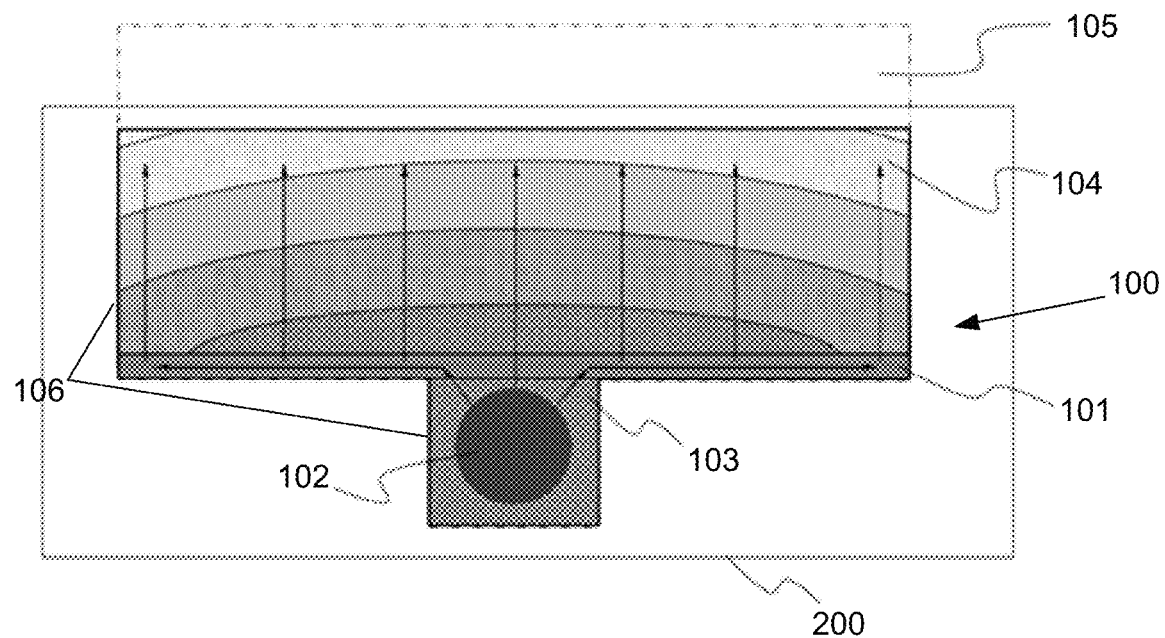
FIG. 1 illustrates a schematic representation of a cross-section of a heat spreader having a folded section and a heat source of an electronic device, according to an embodiment.

The detailed description provided below in connection with the appended drawings is intended as a description of the present embodiments and is not intended to represent the only forms in which the present embodiments may be constructed or utilized. However, the same or equivalent functions and sequences may be accomplished by different embodiments.

Although the present embodiments may be described and illustrated herein as being implemented in a smartphone or a mobile phone, these are only examples of a device having a heat source and needing heat dissipation. The present embodiments are suitable for application in a variety of different types of devices, for example, in tablets, phablets, computers, cameras, game consoles, small laptop computers, smart watches, wearable devices or any other device that has a heat source, wherein a heat spreader is configured to conduct heat from a heat source to exterior of the device. The term 'computer', 'computing-based device', 'device' or 'mobile device' is used herein to refer to a device with processing capability such that it can execute instructions or hardware logics. Such processing capabilities are incorporated into many different devices.

An embodiment relates to folding a heat conductive sheet as close as possible to a heat source of the device so that the heat conductive sheet is acting as a heat conductor and spreader. A folding section of the sheet acts like a heat conductor, such as a heat pipe, laterally conducting thermal energy along a direction of the device. Then the sheet spreads heat across the device. Due to increasing computing power, power dissipation in the device may increase. Heat of the device may create a limit for a maximum processing and operating power, for example a certain type of a limit for the device performance. The heat spreader is configured to conduct and spread heat to the exterior of the device, for example through device covers. Consequently, the device performance may be maintained at a good level. Furthermore, because the heat spreader spreads the heat to the exterior to a relatively large area, cover temperatures may be kept at a reasonable level for user convenience. The heat spreader comprises a heat conductive spreading material such as graphite. The heat spreader may be light compared to other cooling mechanism, such as the heat pipe. For example, the heat spreader may replace fins or other heat sinks, which may make the device lighter.

Heat sources of the device may be very local in mobile devices. For example a processor, CPU, or other micropro- cessor or an application specific integrated circuit, ASIC. The hear spreader is configured to collected heat effectively at the (local) heat source and then spread heat quickly and evenly around the device. The heat spreader having a folding section may replace conventional heat pipe and act like one. The embodied heat spreader may be cheap to manufacture and assemble and may not require additional mechanical parts.

FIG. 1 illustrates a schematic representation of a cross-section of a heat spreader 100 having a folded section 101. A heat source 102 of an electronic device 200 is illustrated, according to an embodiment.

The heat source 102 generates heat and creates warm area 103 as illustrated by a reference 103. The heat source 102 may be local and/or configured at a certain location within the device 200. The folded section 101 is configured close to the heat source 102. The folded section 101, which is added to the heat spreader 100, may dissipate thermal energy more evenly through a surface of the device 200. The folded section 101 is configured to laterally conduct heat. Thus, the folded section 101 dissipates the heat coming from a local heat source 102 laterally. A cool area 104 is illustrates and is located close to a surface of the device 200. The cool area 104 is evenly spread across the cover. Consequently, the heat spreader 100 conducts and spreads the heat from a local heat point substantially evenly to the surface. To a user, the device 200 feels like having a uniform temperature, without an unpleasant hot spot. According to an embodiment, more processing power may be extracted, for example by increasing the current for the processor. For example, a 200 milliAmpere, mA, current may increase heat dissipation by 1 degree Celsius. Because the heat is evenly spread, cooling is effective without local hot spots. A conventional heat spreader 105, without the folded section, is illustrated by a dashed line. The folded section 101 reduces the area needed by the heat spreader 100.

According to an embodiment, the sheet 106 of the heat spreader 100 may be made of a graphite sheet. For example the sheet 106 comprises a polyester, PET, film, a graphite portion and adhesive. The thermal conductivity of the sheet 106 may be around 1000 Watts/milliKelvin, W/mK.

There are various ways how the sheet 106 may be folded a located within the device 200. The configuration of the sheet 106 may conform to the design and engineering of the device 100. For example, the folded section 101 may be embedded in a hole and layers of the sheet conform to shape of an printed circuit board, PCB, of the device 100, and for example a battery of the device 100. The layers of the sheet 106 in the folded section 101 may be in contact with each other. According to another embodiment, these layers are not in contact, but there is air or another material between the layers. The folded section 101 may comprise many layers of sheet 106. According to an embodiment, the folded section 101 has two layers of sheet and three folds. FIGS. 2-5 illustrate embodiments of the configuration of the folded section 101.

Figure 2:
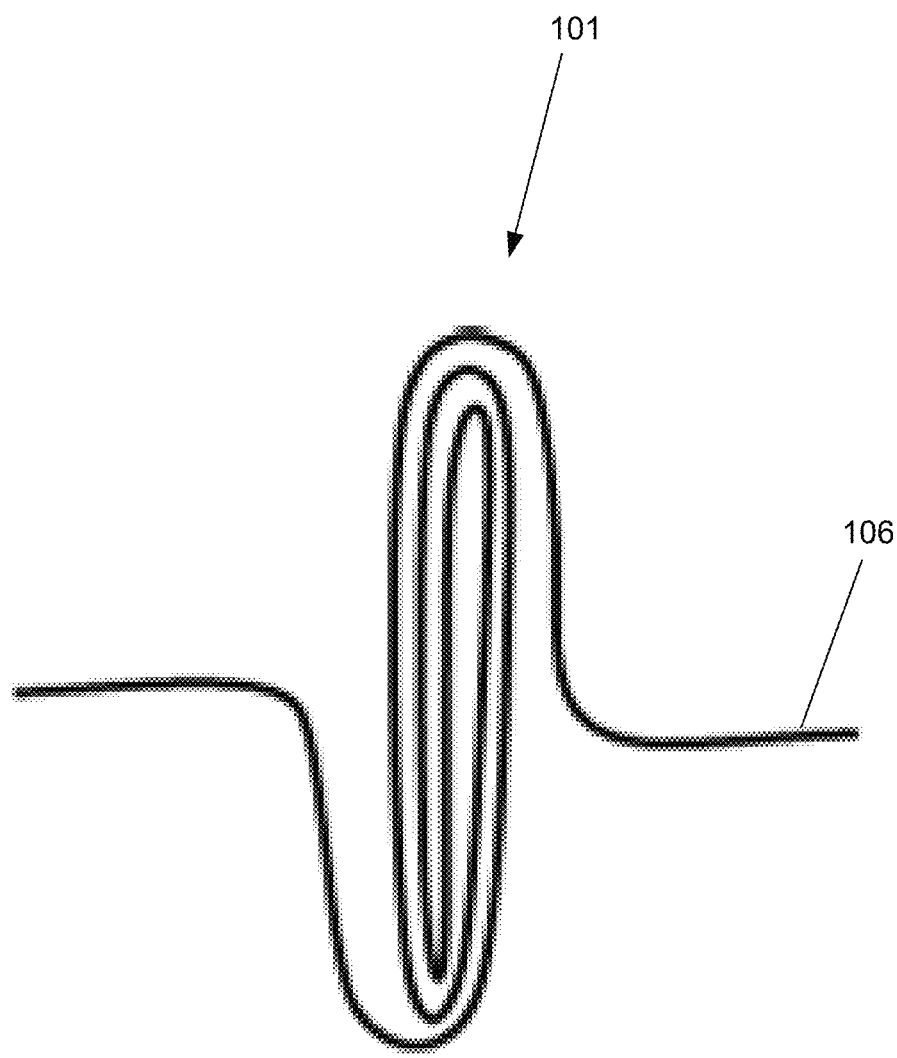
FIG. 2 illustrates a schematic representation of a cross-section of a sheet of a heat spreader, wherein a folded section is in a form of a scroll and transverse to a direction of the sheet, according to an embodiment.

FIG. 2 illustrates a schematic representation of a cross-section of a sheet 106 of a heat spreader 100, wherein a folded section 101 is in a form of a scroll and transverse to a direction of the sheet 106, according to an embodiment.

Figure 3:
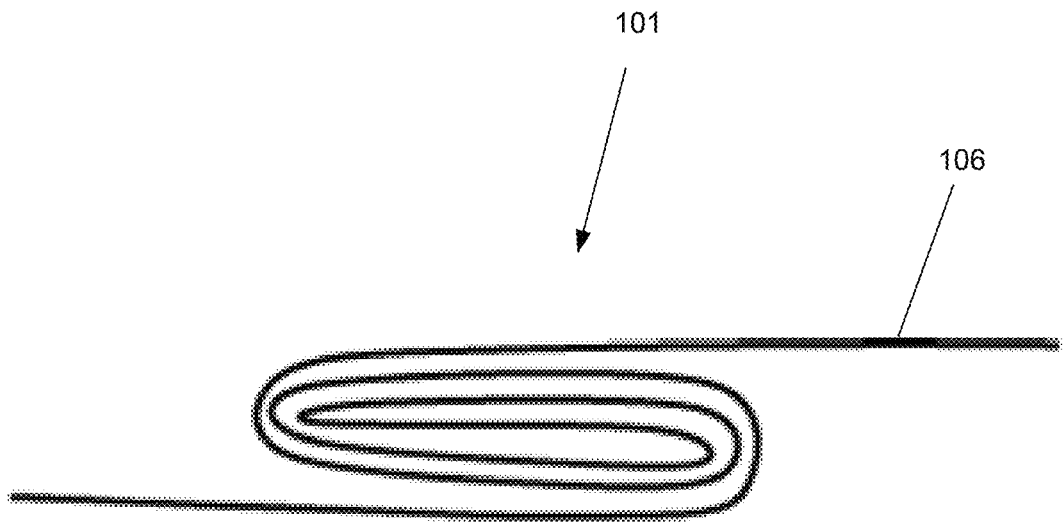
FIG. 3 illustrates a schematic representation of a cross-section of a sheet of a heat spreader, wherein a folded section is in a form of a scroll and in parallel to a direction of the sheet, according to an embodiment.

FIG. 3 illustrates a schematic representation of a cross-section of a sheet 106 of a heat spreader 100, wherein a folded section 101 is in a form of a scroll and in parallel to a direction of the sheet 106, according to an embodiment.

Figure 4:
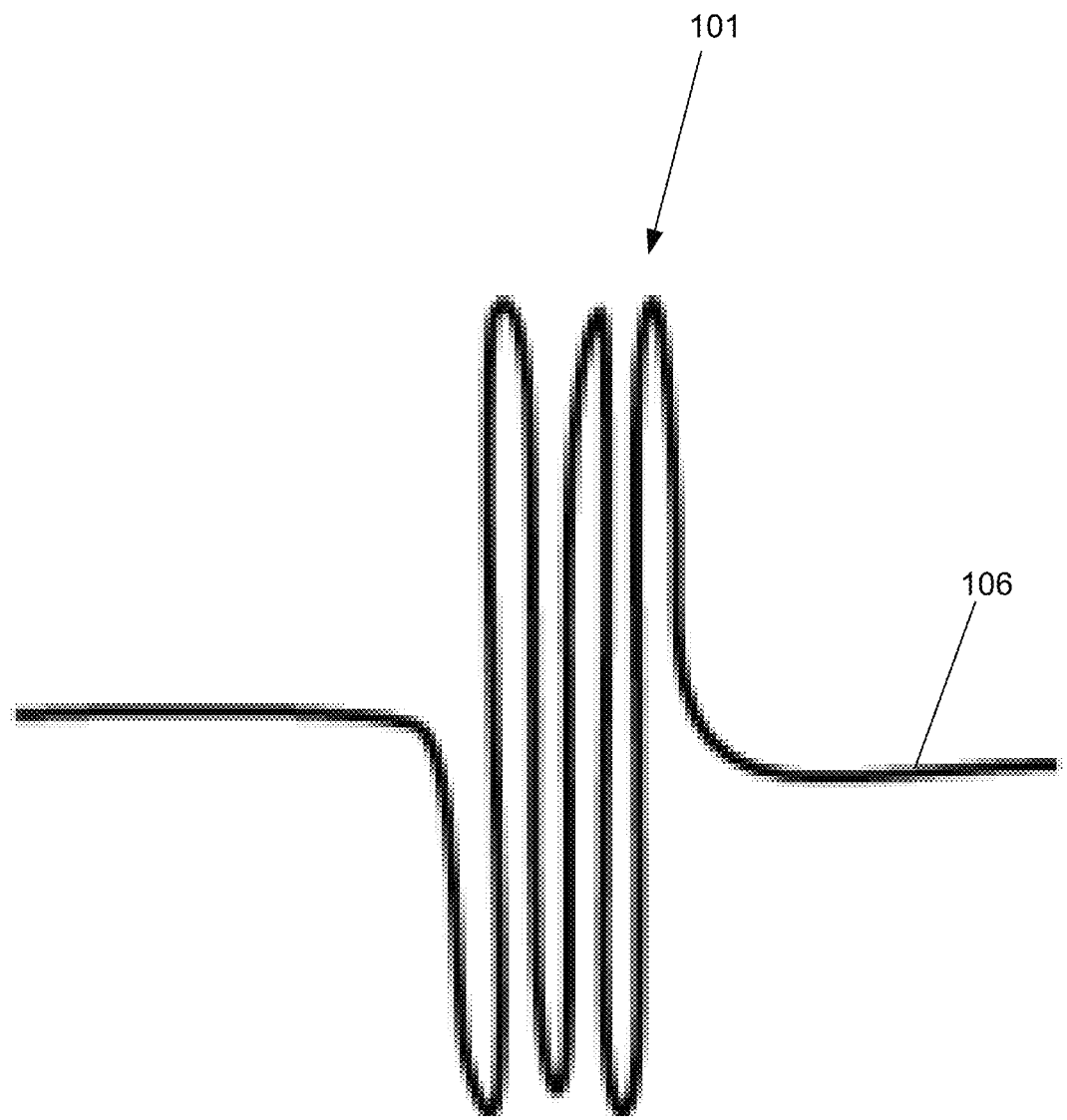
FIG. 4 illustrates a schematic representation of a cross-section of a sheet of a heat spreader, wherein a folded section is in a form of sequential folds and transverse to a direction of the sheet, according to an embodiment.

FIG. 4 illustrates a schematic representation of a cross-section of a sheet 106 of a heat spreader 100, wherein a folded section 101 is in a form of sequential folds and transverse to a direction of the sheet 106, according to an embodiment.

Figure 5:
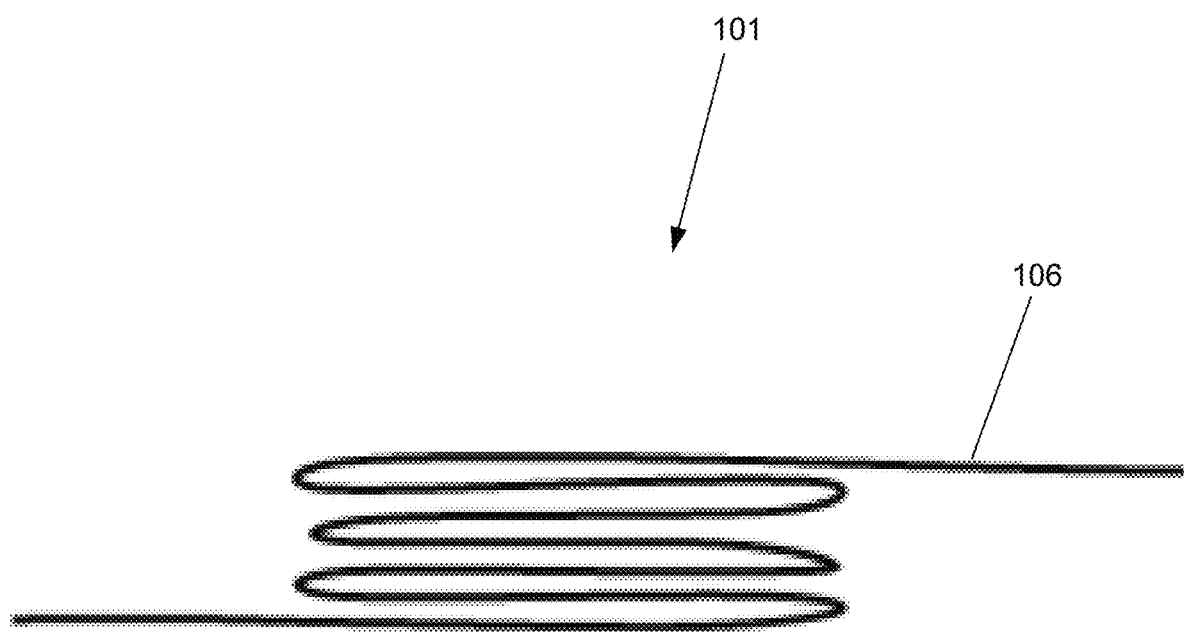
FIG. 5 illustrates a schematic representation of a cross-section of a sheet of a heat spreader, wherein a folded section is in a form of sequential folds and in parallel to a direction of the sheet, according to an embodiment.

FIG. 5 illustrates a schematic representation of a cross-section of a sheet 106 of a heat spreader 100, wherein a folded section 101 is in a form of sequential folds and in parallel to a direction of the sheet 106, according to an embodiment.

Figure 6:
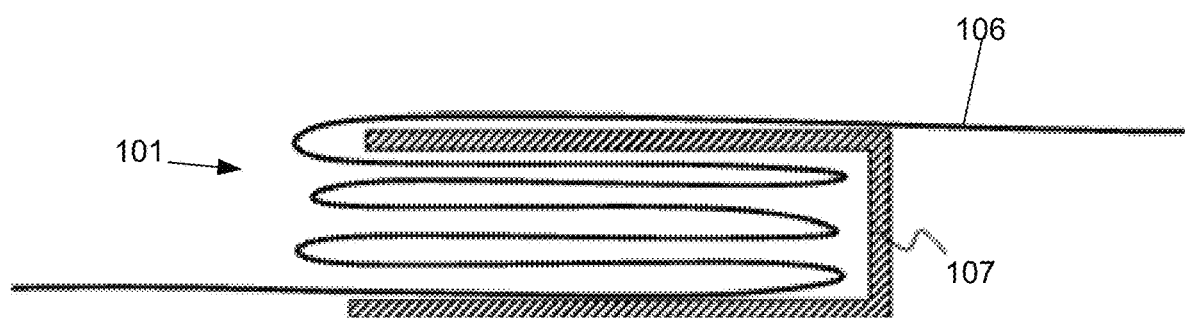
FIG. 6 illustrates a schematic representation of a clamp of a folded section according to an embodiment.

FIG. 6 illustrates a schematic representation of a clamp 107 of a folded section 191 according to an embodiment. The clamp 107 may be used to control and attach the folded section 101. The clamp 107 may receive the folded section 101 and hold it in a folded position. The other layers of the sheet 106 may conform to the shape of the clamp 107, for example as illustrated in FIG. 7.

Figure 7:
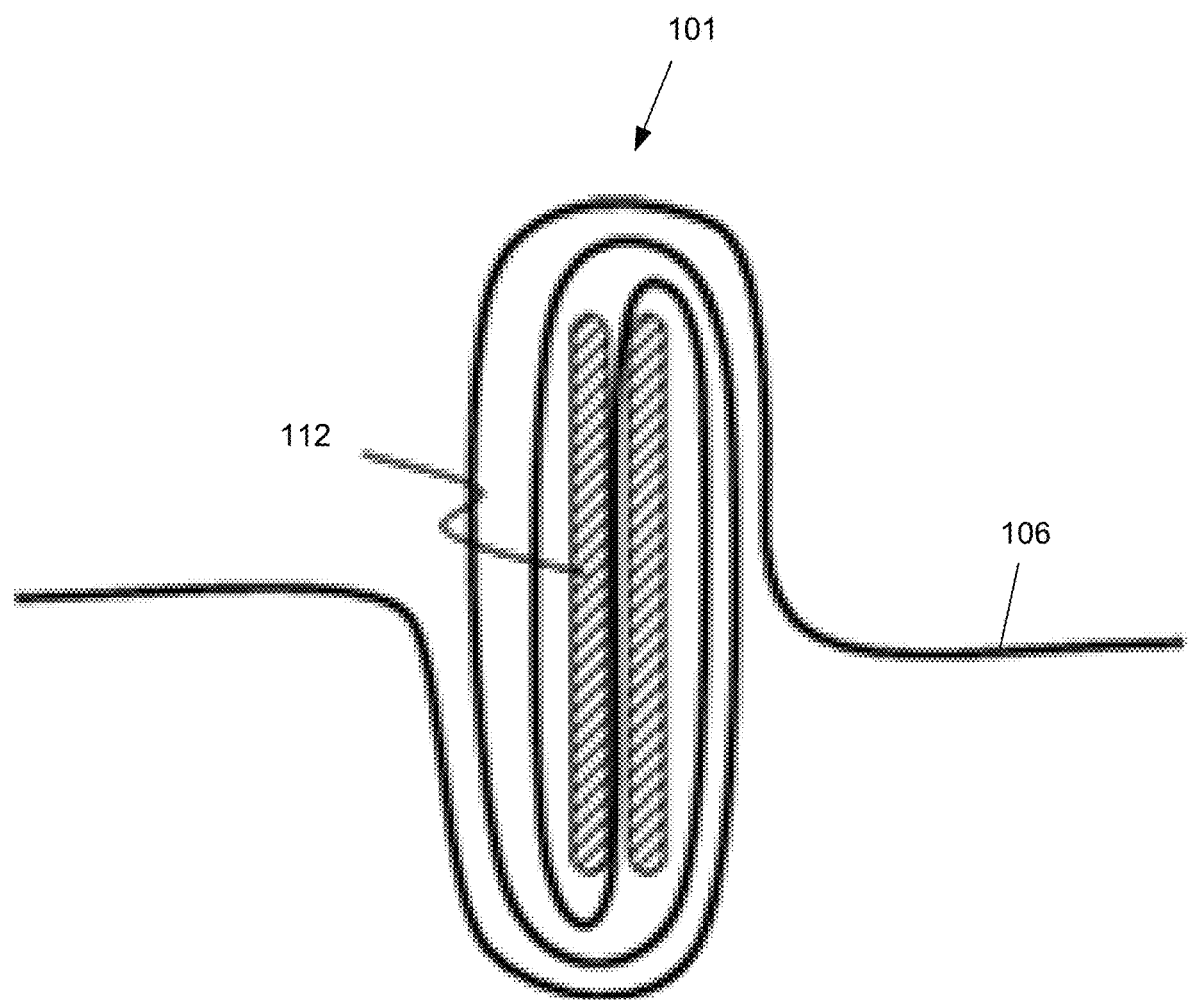
FIG. 7 illustrates a schematic representation of a folded section, which is made around a heat conductor, according to an embodiment.

FIG. 7 illustrates a schematic representation of a folded section 101, which is made around a heat conductor 112, according to an embodiment. The folded section 101 may be folded around a core or several cores. The heat conductor 112 of FIG. 7 is configured so that a layer of sheet 106 is configured between the dual structure of the conductor 108. The layer of the sheet 106 may be in contact with the conductor 108. According to an embodiment the core may be thermally non-functional such as a part of a frame. According to an embodiment the core may be thermally functional heat conductor 112. For example, the sheet 106 is made around a heat pipe. The sheet 106 can effectively conduct heat from the core and spread the heat accordingly. The heat pipe may very effectively conduct heat from a single point to the folded section 101, which may further collect the heat and spread it via the lay of sheet 106.

Figure 8:
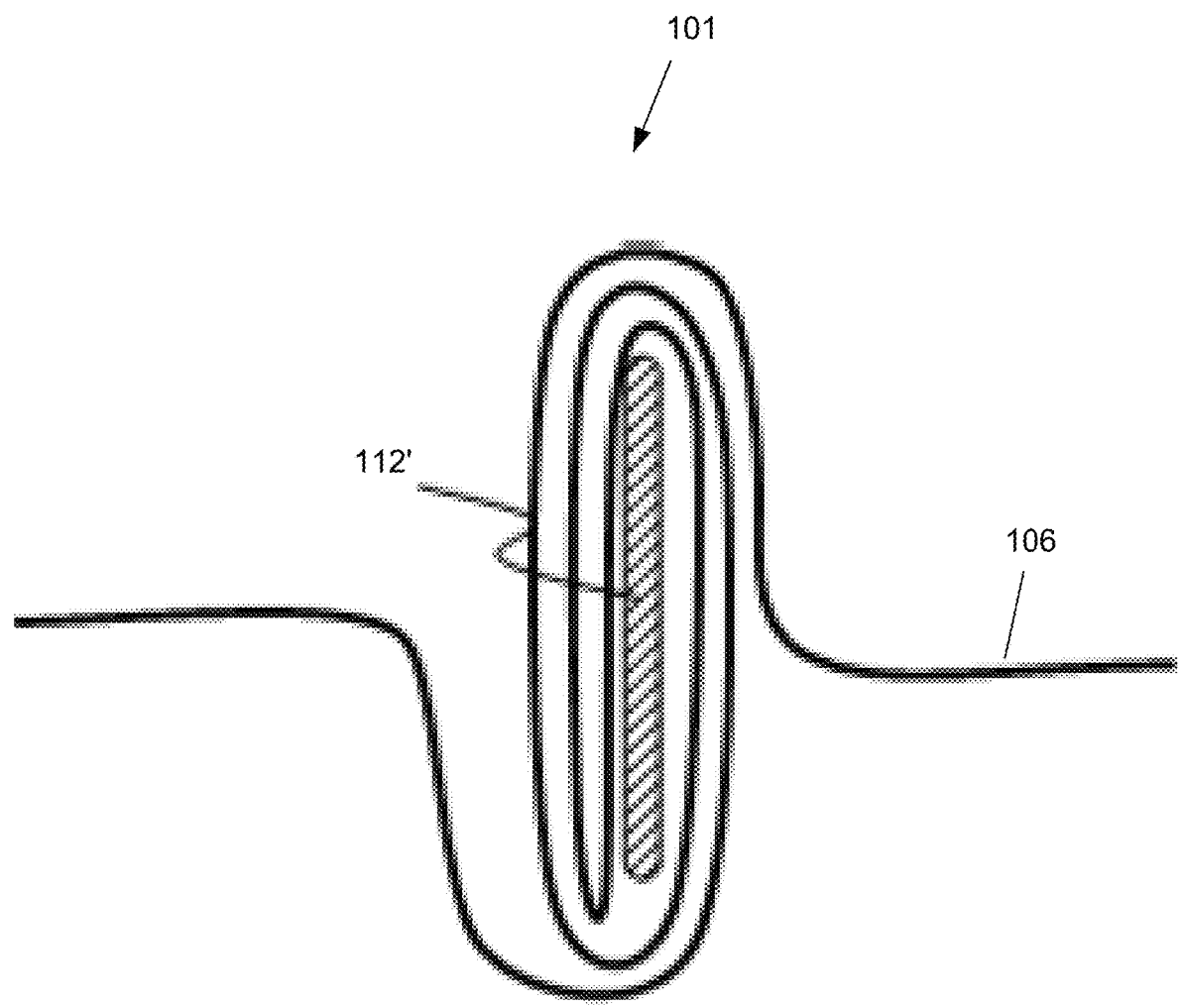
FIG. 8 illustrates a schematic representation of a folded section, which is made around a heat conductor, according to another embodiment.

FIG. 8 illustrates a schematic representation of a folded section 101, which is made around a heat conductor 112' according to another embodiment. The heat conductor 112' is similar to the embodiment of FIG. 7, except the heat conductor 112' may be made of a single element core. A layer of sheet 106 may be configured to be in contact with the conductor 108'.

Figure 9:
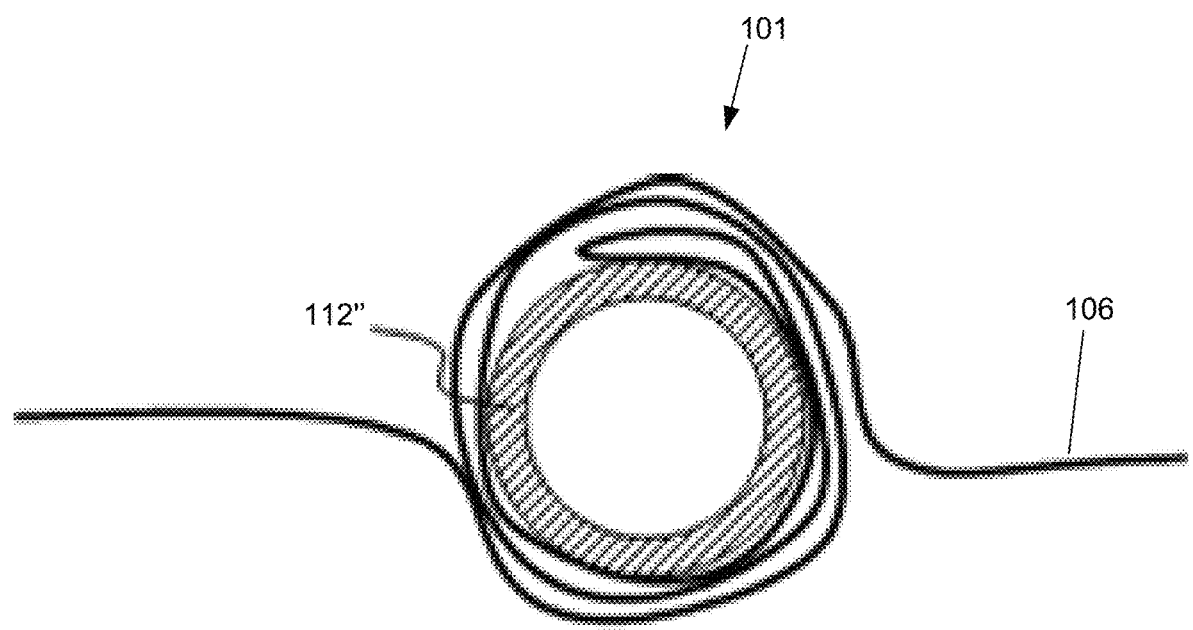
FIG. 9 illustrates a schematic representation of a folded section, which is made around a heat conductor, according to another embodiment.

FIG. 9 illustrates a schematic representation of a folded section 101, which is made around a heat conductor 112", according to another embodiment. The heat conductor 112" is similar to the embodiment of FIG. 7, except that the shape of the heat conductor 112" is a circular core. The folded section 101 may be wrapped around the circular core. A layer of sheet 106 may be configured to be in contact with the conductor 108".

Figure 10:
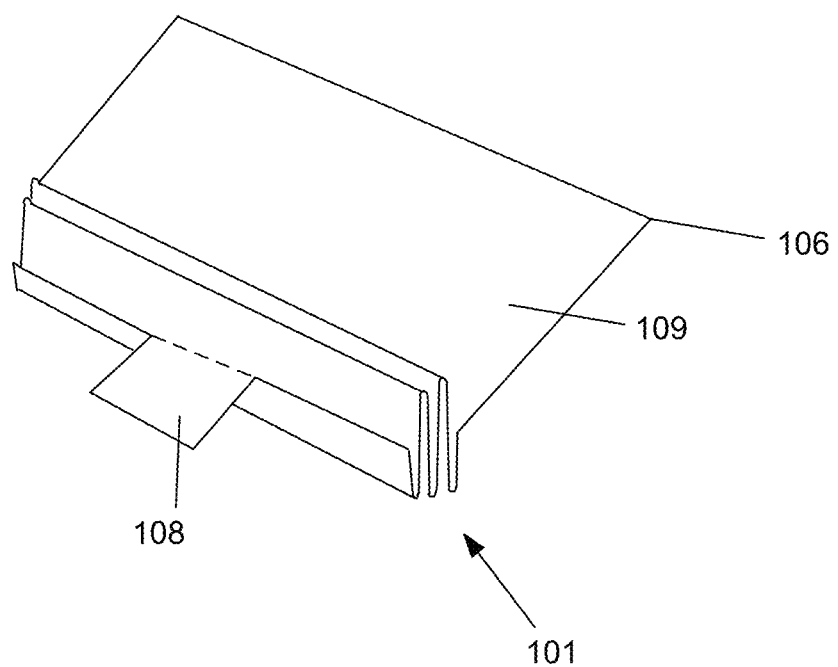
FIG. 10 illustrates a schematic representation of a sheet, wherein folded section is in a form of sequential folds and a shape of the sheet is designed to fit a heat source and the device, according to an embodiment.

FIG. 10 illustrates a schematic representation of a sheet 106, wherein a folded section 101 is in a form of sequential folds and a shape of the sheet 106 is designed to fit a design of a heat source 102 and a device 100, according to an embodiment. The sheet 106 comprises a cutting 108. The cutting 108 may be a part of the sheet 106. The cutting 108 is illustrated in FIG. 10 as being restricted to the sheet 106 by a dashed line. The rest of the sheet 106 continues from the dashed line. The cutting 108 is designed to match the shape of the heat source 102 of the device 100. The cutting 108 may, for example, rest on the heat source 102 and be in contact with it. The cutting 108 collects heat from the heat source 102. The sheet 106 continues from the cutting 108 as the folded section 101. The folded section 101 laterally spreads and evens the heat along the direction of the folds. The folded section 101 is designed to fit a structure between the cutting 108 and a spreader 109 of the sheet 106. For example it may fit into a hole between a PCB and a battery. The sheet 106 continues from the folding section 101 as a spreader 109. The spreader 109 distributed the heat evenly towards the exterior of the device 100, for example, to the cover. The spreader 109 may be configured to fit the shape of a battery and fit between the battery and the cover.

Figure 11:
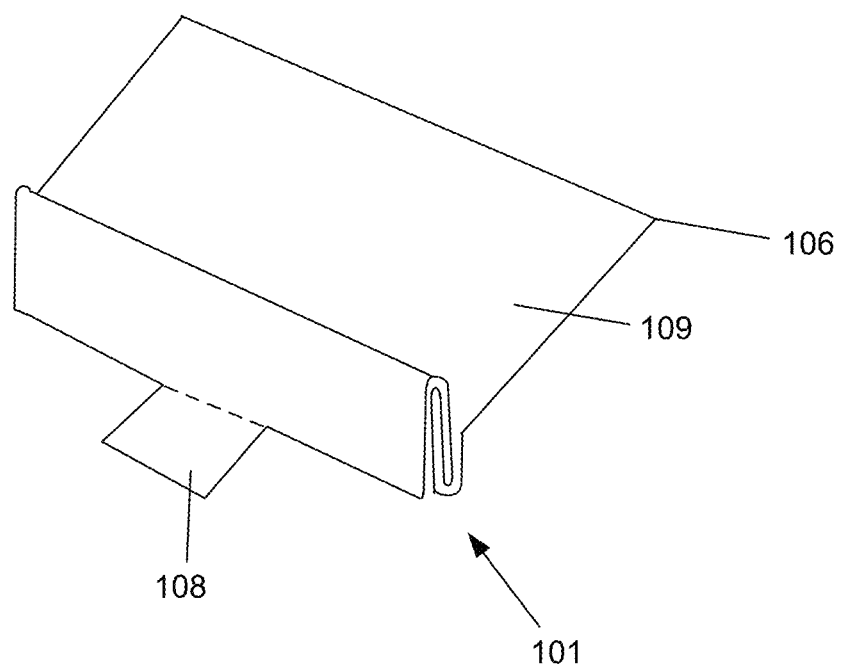
FIG. 11 illustrates a schematic representation of a sheet, wherein folded section is in a form of a scroll and a shape of the sheet is designed to fit a heat source and the device, according to an embodiment.

FIG. 11 illustrates a schematic representation of a sheet 106, wherein folded section 101 is in a form of a scroll and a shape of the sheet 106 is designed to fit a heat source 102 and the device 100, according to an embodiment. The embodiment of FIG. 11 is similar to the embodiment of FIG. 10, except the folding section is in the form of the scroll. The selection between the scroll and the sequential folds may depend on a manufacturing process and devices.

Figure 12:
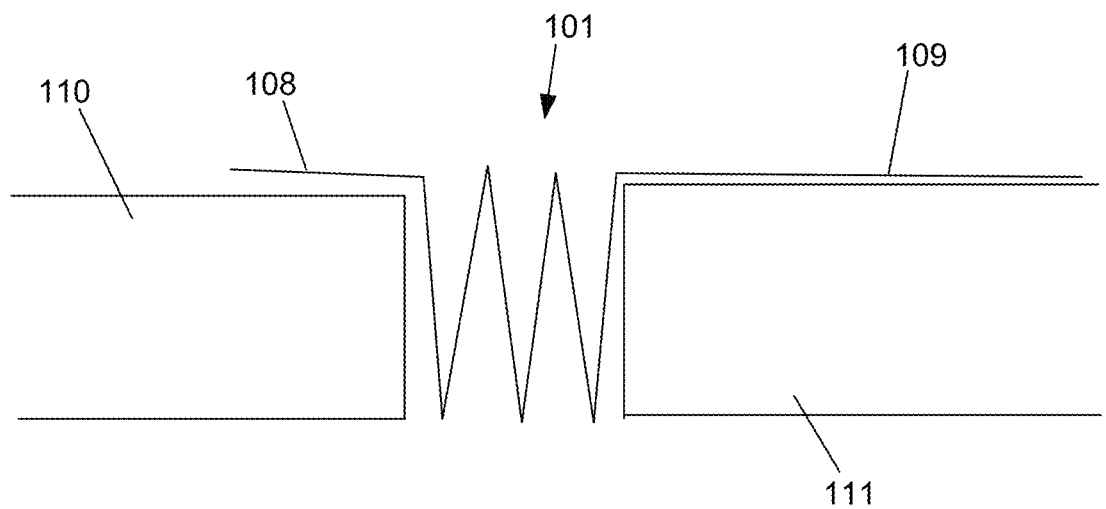
FIG. 12 illustrates a schematic representation of a cross section of a device having a heat spreader, wherein a folded section is in a form of sequential folds and a shape of the sheet is designed based on the device, according to an embodiment.

FIG. 12 illustrates a schematic representation of a cross section of a device 200 having a heat spreader 100, wherein a folded section 101 is in a form of sequential folds and a shape of the sheet is designed based on the device 200, according to an embodiment. The folded section 101 is shown in a gap between a PCB 110 and a battery 111 of the device 200. The cutting 108 rests on the PCB 110. The spreader 109 rests on the battery 111. The sheet 106 of FIG. 12 conforms to the shape and design of the PCB 110 and the battery 110.

Figure 13:
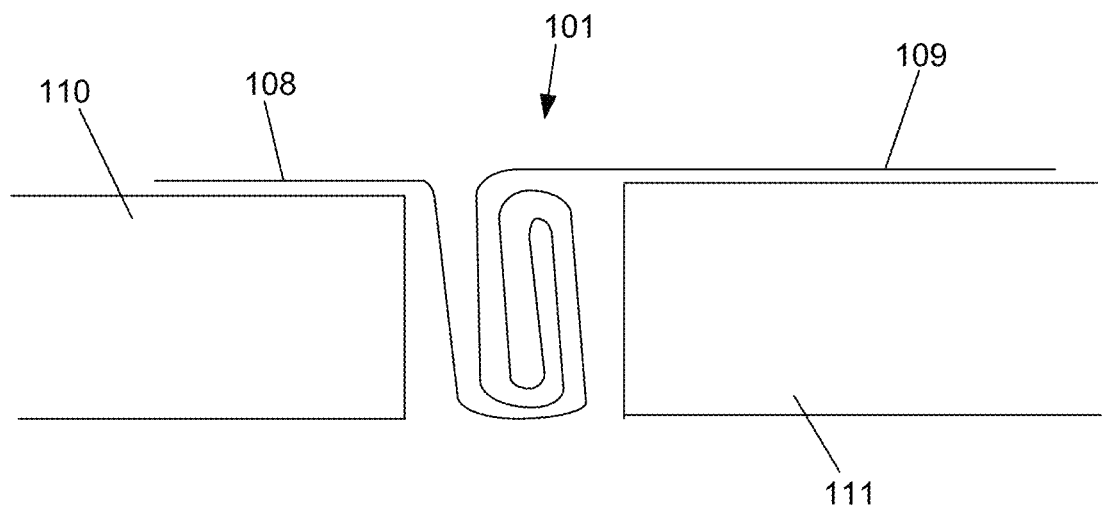
FIG. 13 illustrates a schematic representation of a cross section of a device having a heat spreader, wherein a folded section is in a form of a scroll and a shape of the sheet is designed based on the device, according to an embodiment.

FIG. 13 illustrates a schematic representation of a cross section of a device 200 having a heat spreader 100, wherein a folded section 101 is in a form of a scroll and a shape of the sheet 106 is designed based on the device 200, according to an embodiment. The embodiment of FIG. 13 is similar to FIG. 12, except for the folded section 101 being a scroll.

Figure 14:
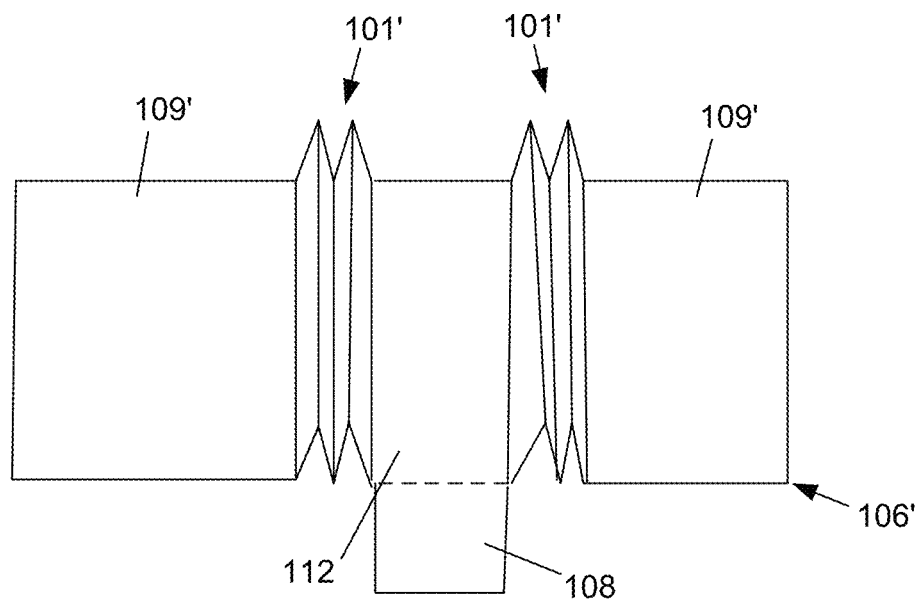
FIG. 14 illustrates a schematic representation of a sheet, wherein two folded sections are configured, according to an embodiment.

FIG. 14 illustrates a schematic representation of a sheet 106', wherein two folded sections 101' are configured, according to an embodiment. The sheet 106' comprises a cutting 108. The sheet 106' of the cutting 108 continues to an intermediate part 112. The intermediate part 112 is connected to two folded sections 101' respectively. The folded section 101' continues to a spreader 109'. The embodiment of FIG. 14 has two spreaders 109'. The embodiment of FIG. 14 may conform to the shape and design of the device 200.

It should be noted that FIGS. 1 to 14 are for illustrative purposes only and any dimensions or relative sizes so illustrated are for representative purposes only and should not be construed as limitations. Further it should be noted that some or all the components illustrated in FIGS. 1 to 14 may or may not be to scale.

Figure 15:
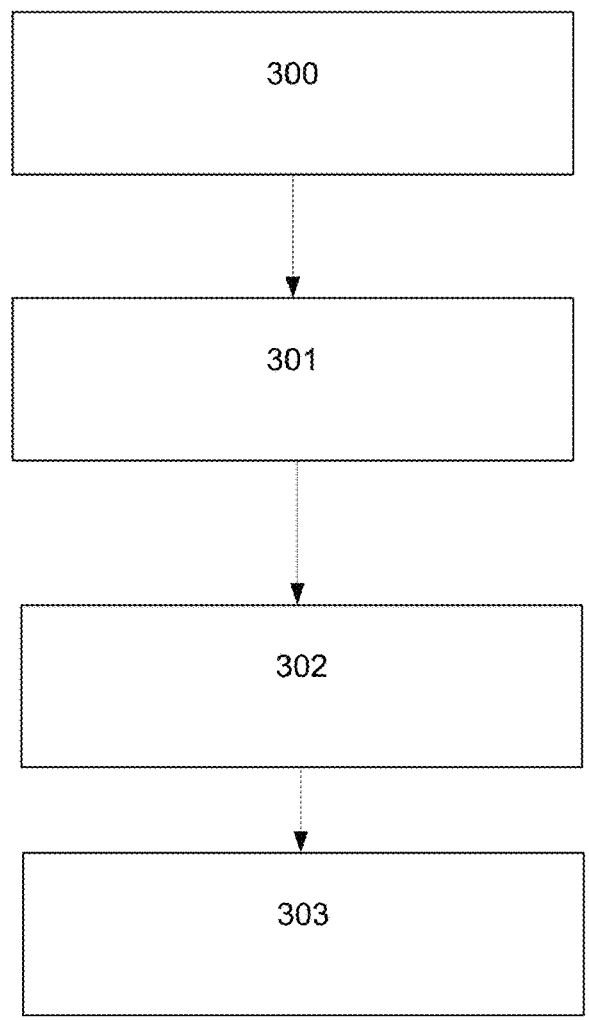
FIG. 15 illustrates a process of manufacturing a heat spreader within a device, in accordance with an illustrative embodiment.

An embodiment of a method for manufacturing the device 200 with the heat spreader 100 is illustrated in FIG. 15.

According to an embodiment, a method comprises the following operations. In operation 300, a heat source 102 is attached to a device 200. For example, a processor may be manufactured to the device 200. In operation 301 a heat conductive sheet 106 is configured on the heat source 102. In operation 302 a cutting 108 is made from the sheet 106 so that a contour of the heat source corresponds with a contour of the cutting 108. In operation 303 a folded section 101 of the sheet 106 is made. For example, the sheet 106 is folded so that a folded section 101 has at least two folds of the sheet establishing at least three superimposed layers of the sheet between the folds. According to an embodiment, three superimposed layers may be used to with two folds. The layers may touch each other or situate close to each other, and heat may be conducted though the superimposed layers. According to an embodiment, the number of folds and superimposed layers may vary. The number of superimposed layers may increase the heat conductivity. According to an embodiment, a scroll may be folded from the sheet 106. In operation 304 a heat spreader 109 is made from the sheet 106. This may be made of a single layer 109 of sheet 106 continuing from the folded section 101. The contour of the single layer 109 corresponds with a contour of a battery 111, according to an embodiment.

Any range or device value given herein may be extended or altered without losing the effect sought. Also any example may be combined to another example unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as embodiments of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the embodiments described above may be combined with aspects of any of the other embodiments described to form further embodiments without losing the effect sought, or without extending beyond the disclosure.

The term 'comprising' is used herein to mean including the method, blocks or elements identified, but that such blocks or elements do not comprise an exclusive list and a method or apparatus may contain additional blocks or elements.

According to an embodiment, an electronic device, comprising: an electronic component as a heat source; and a heat conductive sheet, comprising: a folded section having at least two folds of the sheet establishing at least three superimposed layers of the sheet between the folds, wherein the folded section is configured to conduct heat from the heat source; and a layer of sheet, other than that of the three superimposed layers, wherein the layer of sheet is configured to spread heat across the electronic device, and wherein the layer of sheet receives the heat from the folded section; wherein the superimposed layers are closer to the heat source than the layer of sheet.

Alternatively or in addition to the above, folded section is configured to laterally spread the heat. Alternatively or in addition to the above, the folded section is configured to operate as a heat pipe transferring heat in a direction of the folds. Alternatively or in addition to the above, the sheet comprises flexible graphite sheet. Alternatively or in addition to the above, a direction of the folded section is transversal to a direction of the sheet. Alternatively or in addition to the above, a direction of the folded section is in parallel to a direction of the sheet. Alternatively or in addition to the above, the superimposed layers are in contact to each other's. Alternatively or in addition to the above, the superimposed layers are separated from each other's. Alternatively or in addition to the above, the folded section comprises sequential folds and layers of the sheet between the folds. Alternatively or in addition to the above, the folded section is in a form of a scroll. Alternatively or in addition to the above, further including a clamp configured to bind the folded section. Alternatively or in addition to the above, the folded section further includes a solid core, wherein the sheet of the folded section is configured around the solid core. Alternatively or in addition to the above, the solid core comprises a heat pipe. Alternatively or in addition to the above, the folded section is configured within an opening of the device. Alternatively or in addition to the above, the sheet further includes a cutting configured on the heat source. Alternatively or in addition to the above, the spreader is configured on a battery of the device. Alternatively or in addition to the above, the spreader is configured between the battery and a cover of the device. Alternatively or in addition to the above, further including another folded section and another spreader.

According to an embodiment, a mobile device, comprising: an electronic component as a heat source; and a heat conductive sheet, comprising: a first and a second folded section, each having at least two folds of the sheet establishing at least three superimposed layers of the sheet between the folds, wherein the folded section is configured to conduct heat from the heat source; and two layers of sheet, other than that of the three superimposed layers, wherein the two layers of sheet are configured to spread heat across the electronic device, and wherein the two layer of sheet receives the heat from the folded section.

According to an embodiment, a manufacturing method, comprising: configuring a heat conductive sheet on a heat source of an electrical device so that the heat conductive sheet comprises: a folded section having at least two folds of the sheet establishing at least three superimposed layers of the sheet between the folds, wherein the folded section is configured to conduct heat from the heat source; and a layer of sheet, other than that of the three superimposed layers, wherein the layer of sheet is configured to spread heat across the electronic device, and wherein the layer of sheet receives the heat from the folded section; wherein the superimposed layers are closer to the heat source than the layer of sheet.

The embodiments illustrated and described herein as well as embodiments not specifically described herein but within the scope of aspects of the disclosure constitute exemplary means for conducting and spreading heat from a heat source. For example, the elements illustrated in FIG. 1 to FIG. 14 constitute exemplary means for receiving the heat from a heat source, means for laterally spreading the collected heat to an elongated and narrow area, means for spreading the laterally spread heat along a cover of the device.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. An electronic device, comprising:
   an electronic component as a heat source; and
   a heat conductive sheet, comprising:
      a folded section having at least two folds of the sheet establishing at least three superimposed layers of the sheet between the folds, wherein the folded section conducts heat from the heat source, wherein the folded section further includes a solid core, and wherein the sheet of the folded section encircles the solid core;
      a layer of the heat conductive sheet, other than that of the three superimposed layers, wherein the layer of the heat conductive sheet extends beyond an end of the folded section and spreads heat across the electronic device and towards an exterior of the electronic device, and wherein the layer of the heat conductive sheet receives the heat from the folded section; and
      wherein the superimposed layers are closer to the heat source than the layer of the heat conductive sheet.

2. The device of claim 1, wherein the folded section is configured to laterally spread the heat and the layer of the heat conductive sheet that extends beyond the end of the folded section is configured as a spreader and has a shape that conforms to a shape or contour of an other electronic component to fit and rest on the shape or contour of the other electronic component.

3. The device of claim 1, wherein the folded section is configured to operate as a heat pipe transferring heat in a direction of the folds.

4. The device of claim 1, wherein the sheet comprises flexible graphite sheet.

5. The device of claim 1, wherein a direction of the folded section is transversal to a direction of the sheet and the layer of the heat conductive sheet extends beyond the end of the folded section along a length of the electronic device.

6. The device of claim 1, wherein a direction of the folded section is in parallel to a direction of the sheet.

7. The device of claim 1, wherein the superimposed layers are in contact with each other.

8. The device of claim 1, wherein adjacent layers of the superimposed layers are separated from each other.

9. The device of claim 1, wherein the folded section comprises sequential folds and layers of the sheet between the folds form the three superimposed layers.

10. The device of claim 1, wherein the folded section is in a form of a scroll.

11. The device of claim 1, further including a clamp configured to bind the folded section.

12. The device of claim 1, wherein the sheet further includes a cutting configured on the heat source, wherein the cutting matches a shape of the electronic component.

13. The device of claim 1, wherein the solid core comprises a heat pipe.

14. The device of claim 1, wherein the folded section is configured within an opening of the device.

15. The device of claim 1, wherein the sheet further includes a cutting configured on the heat source, the electronic component is a processor and the other electronic component is a battery, and the cutting abuts and is in direct contact with the electronic component.

16. The device of claim 1, wherein the sheet is configured on a battery of the device.

17. The device of claim 16, wherein the sheet is configured between the battery and a cover of the device.

18. The device of claim 1, further including an other folded section and an other sheet.

19. A mobile device, comprising:
    an electronic component as a heat source; and
    a heat conductive sheet, comprising:
        a first folded section and a second folded section, each having at least two folds of the sheet establishing at least three superimposed layers of the sheet between the folds, wherein the folded section conducts heat from the heat source, wherein the folded section further includes a solid core, and wherein the sheet of the folded section is configured around the solid core;
        two layers of the heat conductive sheet, other than that of the three superimposed layers, wherein the two layers of the heat conductive sheet extend beyond an end of the first and second folded sections and spread heat across the mobile device and towards an exterior of the mobile device, and wherein the two layers of the heat conductive sheet receive the heat from the folded section.

20. A manufacturing method, comprising:
    configuring a heat conductive sheet on a heat source of an electrical device so that the heat conductive sheet comprises:
        a folded section having at least two folds of the sheet establishing at least three superimposed layers of the sheet between the folds, wherein the folded section conducts heat from the heat source, wherein the folded section further includes a solid core, and wherein the sheet of the folded section encircles the solid core;
        a layer of the heat conductive sheet, other than that of the three superimposed layers, wherein the layer of the heat conductive sheet extends beyond an end of the folded section and spreads heat across the electrical device and towards an exterior of the electrical device, and wherein the layer of the heat conductive sheet receives the heat from the folded section;
    wherein the superimposed layers are closer to the heat source than the layer of the heat conductive sheet.

* * * * *